(12) United States Patent
Guidon (10) Patent No.: US 10,054,657 B2
(45) Date of Patent: Aug. 21, 2018

(54) APPARATUS AND METHOD FOR MULTISHOT DIFFUSION WEIGHTED IMAGING WITH ARRAY SPATIAL PSEUDO-SENSITIVITY ENCODING TECHNIQUE

(71) Applicant: General Electric Company, Schenectady, NY (US)

(72) Inventor: Arnaud Guidon, Cambridge, MA (US)

(73) Assignee: GENERAL ELECTRIC COMPANY, Schenectady, NY (US)

(*) Notice: Subject to any disclaimer, the term of this patent is extended or adjusted under 35 U.S.C. 154(b) by 630 days.

(21) Appl. No.: 14/683,545

(22) Filed: Apr. 10, 2015

(65) Prior Publication Data

US 2016/0299207 A1 Oct. 13, 2016

(51) Int. Cl.
*G01R 33/563* (2006.01)
*G01R 33/565* (2006.01)
*G01R 33/561* (2006.01)

(52) U.S. Cl.
CPC . *G01R 33/56341* (2013.01); *G01R 33/56509* (2013.01); *G01R 33/5611* (2013.01)

(58) Field of Classification Search
CPC .............. G01R 33/34; G01R 33/34007; G01R 33/3635; G01R 33/48; G01R 33/4818; G01R 33/481; G01R 33/4824; G01R 33/446; G01R 33/4835; G01R 33/4828; G01R 33/54; G01R 33/543; G01R 33/565; G01R 33/5611; G01R 33/5612; G01R 33/56341; G01R 33/56509; G01R 33/583; G01R 33/5659; G01R 33/56518; G01R 33/56536; G01R 33/56572; G01R 33/5614; G01R 33/341
(Continued)

(56) References Cited

U.S. PATENT DOCUMENTS

| | | | |
|---|---|---|---|
| 2003/0055330 A1 | 3/2003 | King et al. | |
| 2006/0094952 A1* | 5/2006 | Ma .......................... | A61B 5/055 600/410 |

(Continued)

FOREIGN PATENT DOCUMENTS

| | | |
|---|---|---|
| EP | 1260826 A2 | 11/2002 |
| WO | 01-69277 A2 | 9/2001 |

OTHER PUBLICATIONS

International Search Report and Written Opinion for International Application No. PCT/US2016/026621, dated Jul. 4, 2016. 9 pages.

(Continued)

*Primary Examiner* — Thang Le (57) ABSTRACT

A method for magnetic resonance imaging includes unwrapping a calibration image based on coil sensitivity data obtained according to an array spatial sensitivity encoding technique and acquiring raw scan data of a plurality of MRI scan shots. The method further includes reconstructing an aliased image for each of the MRI scan shots, reconstructing an unaliased image for each of the MRI scan shots, according to the calibration image, recovering a plurality of pseudo-sensitivity maps from the plurality of unaliased images and from the calibration image, and unwrapping at least one final unaliased image from the plurality of aliased images, according to the plurality of pseudo-sensitivity maps.

20 Claims, 6 Drawing Sheets

(58) Field of Classification Search
USPC .................................................. 324/300–322
See application file for complete search history.

(56) References Cited

U.S. PATENT DOCUMENTS

| | | | | |
|---|---|---|---|---|
| 2008/0197844 | A1* | 8/2008 | Ying ................... | G01R 33/5611 |
| | | | | 324/309 |
| 2010/0244825 | A1* | 9/2010 | Brau ................... | G01R 33/5611 |
| | | | | 324/309 |
| 2011/0121831 | A1 | 5/2011 | Kubota et al. | |
| 2012/0319686 | A1* | 12/2012 | Jesmanowicz ......... | A61B 5/055 |
| | | | | 324/309 |
| 2013/0187652 | A1* | 7/2013 | Hu ...................... | G01R 33/3415 |
| | | | | 324/309 |
| 2013/0281831 | A1 | 10/2013 | Riederer | |
| 2014/0002078 | A1 | 1/2014 | Chen et al. | |
| 2014/0376794 | A1* | 12/2014 | Dumoulin .......... | G01R 33/5611 |
| | | | | 382/131 |
| 2015/0241537 | A1* | 8/2015 | Dannels ........... | G01R 33/56554 |
| | | | | 324/309 |

OTHER PUBLICATIONS

G. Clarke; Parallel MRI Imaging; AAPM 2007—Continuing Education; Jul. 23, 2007, pp. 1-10.
Pruessmann, K.P., Weiger, M., Scheidegger, M., Boesiger, P., 1999. SENSE: sensitivity encoding for fast MRI. Magn Reson Med 42, 952-962.

* cited by examiner

$$I = \begin{bmatrix} i_0(y) & i_1(y) & \cdots & i_{N-1}(y) \end{bmatrix}^T$$

$$S = \begin{bmatrix} s_0(y) & s_0(y+D) & \cdots & s_0(y+(A-1)D) \\ \vdots & \vdots & \ddots & \vdots \\ s_{N-1}(y) & s_{N-1}(y+D) & \cdots & s_{N-1}(y+(A-1)D) \end{bmatrix}$$

$$M = \begin{bmatrix} m(y) & m(y+D) & \cdots & m(y+(A-1)D) \end{bmatrix}^T$$

$$\hat{I} = \begin{bmatrix} i_{0,1}(y) & i_{1,1}(y) & \cdots & i_{N-1,1}(y) & \cdots & i_{0,n}(y) & \cdots & i_{N-1,n}(y) \end{bmatrix}^T$$

$$\hat{S} = \begin{bmatrix} \hat{s}_0^0(y) & \hat{s}_0^0(y+D) & \cdots & \hat{s}_0^0(y+(A-1)D) \\ \vdots & \vdots & \ddots & \vdots \\ \hat{s}_{N-1}^0(y) & \hat{s}_{N-1}^0(y+D) & \cdots & \hat{s}_{N-1}^0(y+(A-1)D) \\ \hat{s}_0^1(y) & \hat{s}_0^1(y+D) & \cdots & \hat{s}_0^1(y+(A-1)D) \\ \vdots & \vdots & \ddots & \vdots \\ \hat{s}_{N-1}^1(y) & \hat{s}_{N-1}^1(y+D) & \cdots & \hat{s}_{N-1}^1(y+(A-1)D) \\ \cdots & \cdots & & \cdots \\ \vdots & \vdots & \ddots & \vdots \\ \cdots & \cdots & & \cdots \\ \hat{s}_0^n(y) & \hat{s}_0^n(y+D) & \cdots & \hat{s}_0^n(y+(A-1)D) \\ \vdots & \vdots & \ddots & \vdots \\ \hat{s}_{N-1}^n(y) & \hat{s}_{N-1}^n(y+D) & \cdots & \hat{s}_{N-1}^n(y+(A-1)D) \end{bmatrix}$$

$$M = \begin{bmatrix} m(y) & m(y+D) & \cdots & m(y+(A-1)D) \end{bmatrix}^T$$

ABRATION IMAGE, RECOVERING A PLURALITY OF PSEUDO-SENSITIV-

APPARATUS AND METHOD FOR MULTISHOT DIFFUSION WEIGHTED IMAGING WITH ARRAY SPATIAL PSEUDO-SENSITIVITY ENCODING TECHNIQUE

BACKGROUND

Technical Field

Embodiments of the invention relate generally to magnetic resonance imaging (MRI). Particular embodiments relate to enhancing the clarity of images produced by diffusion-weighted imaging.

Discussion of Art

In magnetic resonance imaging (MRI), human or other animal tissue is subjected to a uniform magnetic field, i.e., a polarizing field B0, so that the individual magnetic moments of particle spins in the tissue attempt to align with the polarizing field, but precess about the field in random order at their characteristic Larmor frequency. If the tissue is subjected to an RF magnetic field, i.e., excitation field B1, which defines an x-y plane and varies at a frequency near a Larmor frequency of selected particles, the net aligned moment, or "longitudinal magnetization" of those selected particles, may be rotated, or "tipped", into the x-y plane to produce a net transverse magnetic moment. After B1 is terminated, the tipped spins "relax" back into the precession defined by B0, and, as a result, produce RF signals. The RF signals may be received and processed to form an image. In order to form a pixelated image for human interpretation, gradient magnetic fields, Gx, Gy, Gz, are applied to localize the tissue response to B1.

Diffusion MRI (or dMRI) is a magnetic resonance imaging method, which facilitates mapping of the diffusion process of molecules, mainly water, in biological tissues, in vivo and non-invasively. Such mapping in turn allows a diagnostician to identify tissue abnormalities. A popular form of dMRI is diffusion weighted imaging (DWI) in which the intensity of each image element, i.e., voxel, reflects the best estimate of the rate of water diffusion at that location. This is significant in that the mobility of water is driven by thermal agitation and highly dependent on its cellular environment. As a result, the hypothesis behind DWI is that findings may indicate early pathologic change. For instance, DWI is more sensitive to early changes after a stroke than more traditional MRI measurements such as T1 or T2 relaxation rates.

The gradients used for DWI, however, can cause hypersensitization to subject motion, which leads to destructive phase inconsistencies, such as aliasing, in segmented acquisition modes.

In view of the above, it is desirable to provide apparatus and methods for efficiently unwrapping motion-aliased images, so that diffusion weighted images can be more readily usable. Such apparatus and methods might also be helpful toward correcting for motion artifacts, generally.

BRIEF DESCRIPTION

Embodiments of the invention provide a method for magnetic resonance imaging includes unwrapping a calibration image based on coil sensitivity data obtained according to an array spatial sensitivity encoding technique and acquiring raw scan data of a plurality of MRI scan shots. The method further includes reconstructing an aliased image for each of the MRI scan shots, reconstructing an unaliased image for each of the MRI scan shots, according to the calibration image, recovering a plurality of pseudo-sensitivity maps from the plurality of unaliased images and from the calibration image, and unwrapping at least one final unaliased image from the plurality of aliased images, according to the plurality of pseudo-sensitivity maps.

Other embodiments provide an apparatus that includes an RF antenna having multiple coils; a controller operatively connected to energize the RF antenna and to receive signals from the RF antenna; and an image processor operatively connected to receive raw scan data from the controller and configured to implement a method that includes unwrapping a calibration image based on coil sensitivity data obtained according to an array spatial sensitivity encoding technique; acquiring raw scan data of a plurality of MRI scan shots; reconstructing an aliased image for each of the MRI scan shots; reconstructing an unaliased image for each of the MRI scan shots, according to the calibration image; recovering a plurality of pseudo-sensitivity maps from the plurality of unaliased images and from the calibration image; and unwrapping at least one final unaliased image from the plurality of aliased images, according to the plurality of pseudo-sensitivity maps.

Yet other embodiments implement a method for magnetic resonance imaging, which includes unwrapping a calibration image based on coil sensitivity data obtained from a sequence of first echoes, according to an array spatial sensitivity encoding technique; acquiring a plurality of MRI scan shots from a sequence of second echoes; reconstructing an aliased image for each of the MRI scan shots; reconstructing an unaliased image for each of the MRI scan shots, according to the calibration image; recovering a plurality of pseudo-sensitivity maps from the plurality of unaliased images and from the calibration image; and unwrapping at least one final unaliased image from the plurality of aliased images, according to the plurality of pseudo-sensitivity maps.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description. Embodiments of the invention described herein provide apparatus and methods for efficiently unwrapping motion-aliased images, so that diffusion weighted images can be more readily usable. In certain embodiments, such apparatus and methods may be useful in correcting for motion artifacts in general.

Specific embodiments provide for measuring random shot-to-shot phase variations and utilizing sensitivity information to estimate an optimal unaliased MRI image. Unaliased phase maps are obtained from each undersampled shot of a multishot acquisition, and are combined with coil sensitivities to create a set of pseudo-sensitivities. Aliasing unwrapping then is performed jointly for all shots in a single step, treating each shot as an additional set of channel data. As such, the inventive method thereby allows for an estimate of a proper number of aliases at each voxel and for the computation of inverse sensitivities.

As used herein, the terms "substantially," "generally," and "about" indicate conditions within reasonably achievable manufacturing and assembly tolerances, relative to ideal desired conditions suitable for achieving the functional purpose of a component or assembly.

As used herein, the term "spin" refers to a fundamental property of subatomic particles such as protons, electrons, and neutrons. Individual unpaired subatomic particles each possess +/−½ spin. The term "B0" refers to a constant magnetic field applied to an imaging subject in order to align the spins of atoms within the subject. The term "B1" refers to a radio-frequency magnetic field applied transverse to B0 in order to perturb the spins of atoms within the subject.

Figure 1:
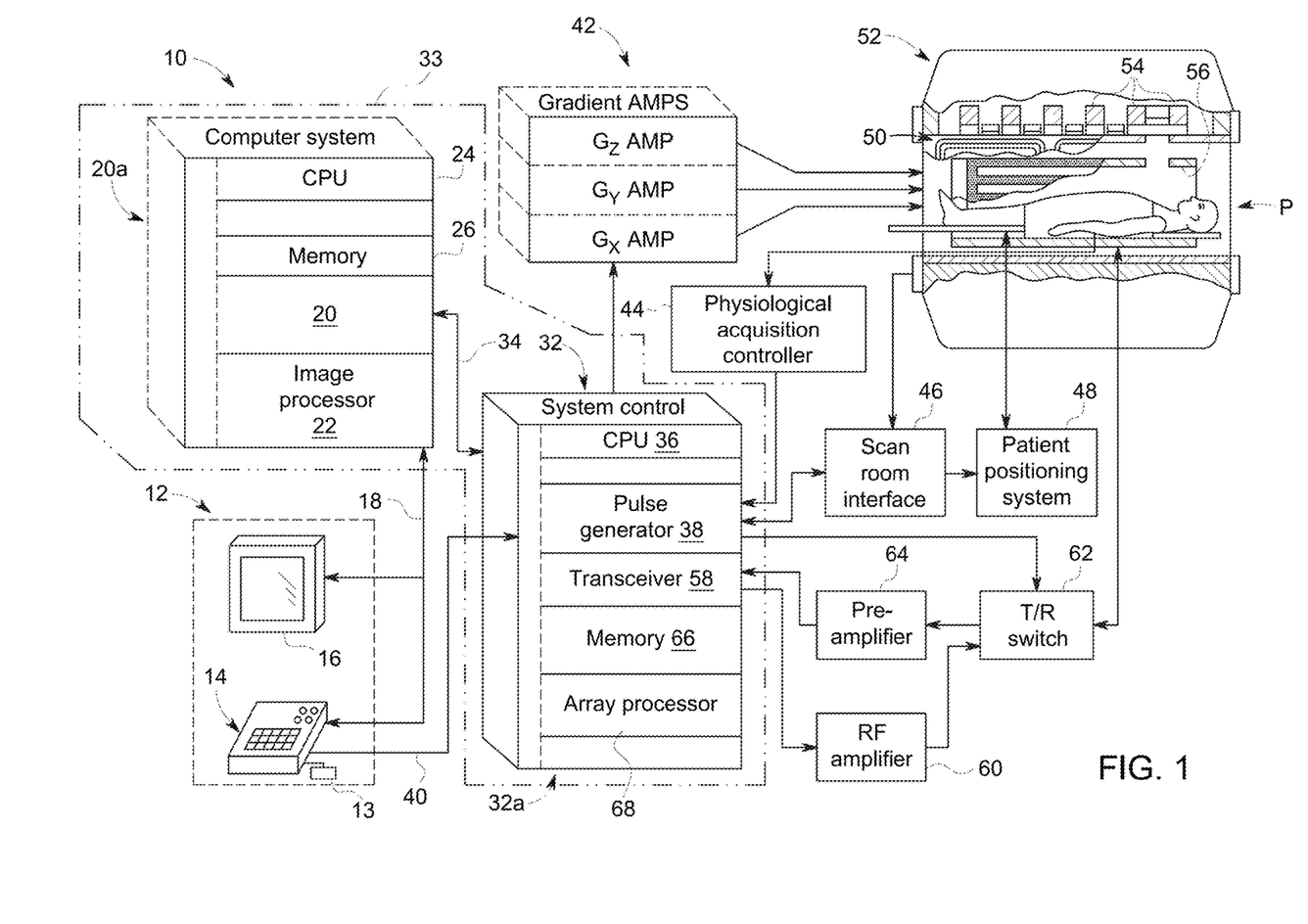
FIG. 1 shows schematically an exemplary MRI system.

FIG. 1 shows major components of an exemplary magnetic resonance imaging system 10 that incorporates embodiments of the present invention. The operation of the system is controlled from an operator console 12, which includes a keyboard or other input device 13, a control panel 14, and a display screen 16. The input device 13 can include a mouse, joystick, keyboard, track ball, touch activated screen, light wand, voice control, or any similar or equivalent input device, and may be used for interactive geometry prescription. The console 12 communicates through a link 18 with a separate computer system 20 that enables an operator to control the production and display of images on the display screen 16. The system 20 includes a number of modules that communicate with each other through a backplane 20a. The modules include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate MRI system control 32 through a high-speed signal link 34. The computer system 20 and the MRI system control 32 collectively form an "MRI controller" 33.

The MRI system control 32 includes a set of modules connected together by a backplane 32a. These include a CPU module 36 as well as a pulse generator module 38. The CPU module 36 connects to the operator console 12 through a data link 40. It is through link 40 that the MRI system control 32 receives commands from the operator to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to several components that are operated by the MRI controller 33, including the pulse generator module 38 (which controls a gradient amplifier 42, further discussed below), a physiological acquisition controller ("PAC") 44, and a scan room interface circuit 46.

The CPU module 36 receives patient data from the physiological acquisition controller 44, which receives signals from a number of different sensors connected to the patient, such as ECG signals from electrodes attached to the patient. And finally, the CPU module 36 receives from the scan room interface circuit 46, signals from various sensors associated with the condition of the patient and the magnet system. It is also through the scan room interface circuit 46 that the MRI controller 33 commands a patient positioning system 48 to move the patient or client C to a desired position for the scan.

The pulse generator module 38 operates the gradient amplifiers 42 to achieve desired timing and shape of the gradient pulses that are produced during the scan. The gradient waveforms produced by the pulse generator module 38 are applied to the gradient amplifier system 42 having Gx, Gy, and Gz amplifiers. Each gradient amplifier excites a corresponding physical gradient coil in a gradient coil assembly, generally designated 50, to produce the magnetic field gradients used for spatially encoding acquired signals. The gradient coil assembly 50 forms part of a magnet assembly 52, which also includes a polarizing magnet 54 (which, in operation, provides a homogeneous longitudinal magnetic field B0 throughout a target volume 55 that is enclosed by the magnet assembly 52) and a whole-body RF antenna 56 (which, in operation, provides a transverse magnetic field B1 that is generally perpendicular to B0 throughout the target volume 55).

In an embodiment of the invention, RF antenna 56 is a multi-channel antenna that includes a plurality of coils. A transceiver module 58 in the MRI system control 32 produces pulses that are amplified by an RF amplifier 60 and coupled to the RF antenna 56 by a transmit/receive switch 62. The resulting signals emitted by the excited nuclei in the patient may be sensed by the same RF antenna 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 32 to electrically connect the RF amplifier 60 to the antenna 56 during the transmit mode and to connect the preamplifier 64 to the antenna 56 during the receive mode. The transmit/receive switch 62 can also enable a separate RF coil (for example, a surface coil) to be used in either transmit mode or receive mode.

After the multi-channel RF antenna 56 picks up the RF signals produced from excitation of the target, the transceiver module 58 digitizes these signals. The MRI controller 33 then processes the digitized signals by Fourier transform to produce k-space data, which then is transferred to a memory module 66, or other computer readable media, via the MRI system control 32. "Computer readable media" may include, for example, structures configured so that electrical, optical, or magnetic states may be fixed in a manner perceptible and reproducible by a conventional computer: e.g., text or images printed to paper or displayed on a screen, optical discs, or other optical storage media; "flash" memory, EEPROM, SDRAM, or other electrical storage media; floppy or other magnetic discs, magnetic tape, or other magnetic storage media.

A scan is complete when an array of raw k-space data has been acquired in the computer readable media 66. This raw k-space data is rearranged into separate k-space data arrays for each image to be reconstructed, and each of these is input to an array processor 68 which operates to Fourier transform the data into an array of image data. This image data is conveyed through the data link 34 to the computer system 20 where it is stored in memory. In response to commands received from the operator console 12, this image data may be archived in long-term storage or it may be further processed by the image processor 22 and conveyed to the operator console 12 and presented on the display 16.

Figure 2:
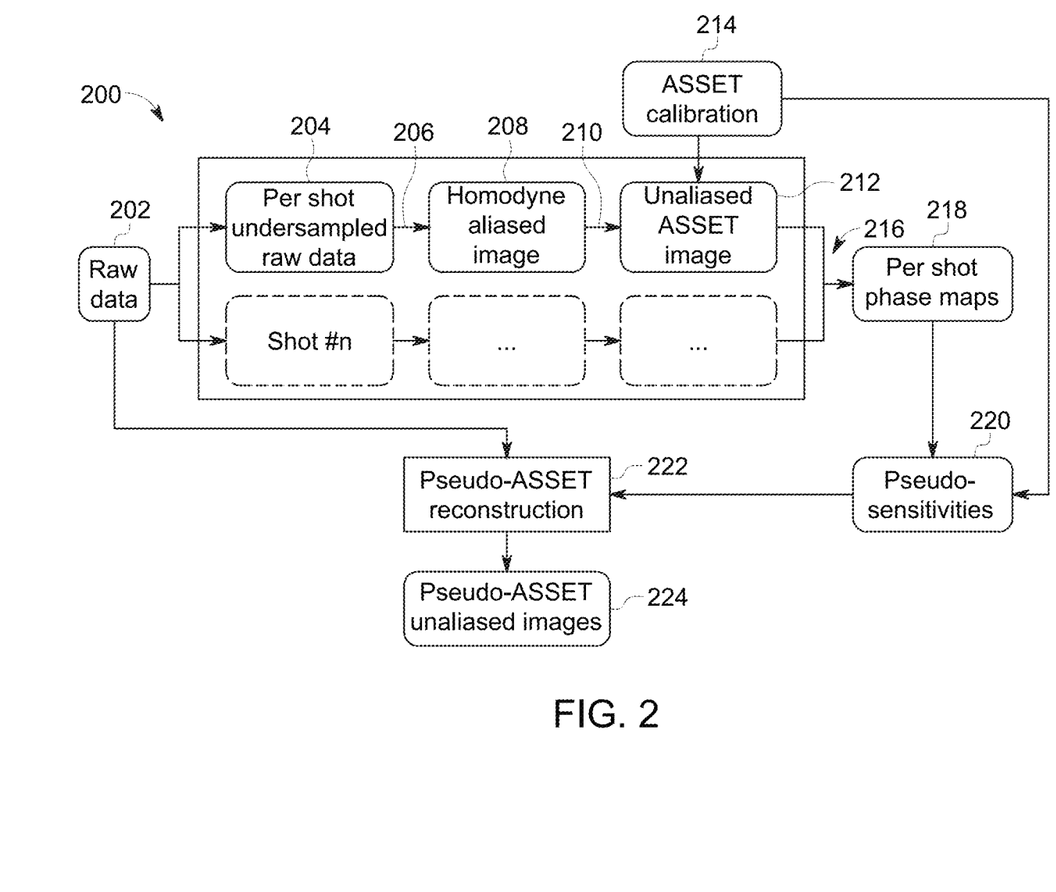
FIG. 2 shows schematically a method for unwrapping a multi-shot magnetic resonance image to obtain a diffusion-weighted image according to an embodiment of the invention that can be implemented utilizing the MRI system of FIG. 1.
Figure 3:
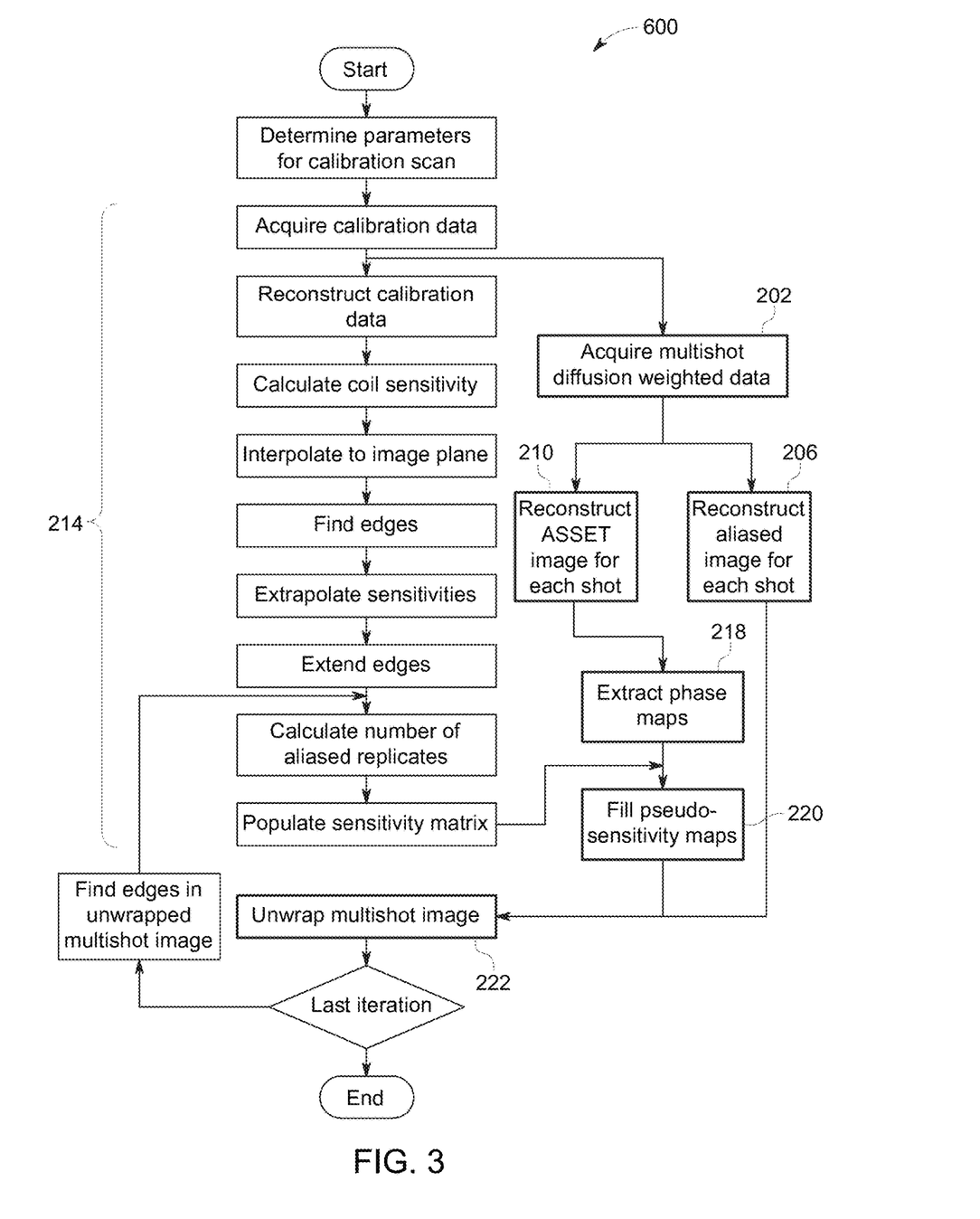
FIG. 3 shows schematically detailed steps for implementing the method of FIG. 2.

FIGS. 2 and 3 show schematically a method 200, implemented by the image processor 22 according to embodiments of the invention. According to the method, the image processor 22 first retrieves or directly receives the raw k-space data 202, e.g., diffusion weighted k-space data for multiple MRI scan shots. The processor 22 then processes the data on a per-shot basis, i.e. as undersampled raw data 204 for each of the MRI scan shots. Utilizing conventional methods, the image processor 22 processes the raw data 204 by computing or reconstructing 206 a homodyne aliased image 208 for each MRI scan shot. The image processor 22 then computes or reconstructs 210 a set of unaliased images 212, according to a known ASSET ("array spatial sensitivity encoding technique") calibration process 214, with each of the unaliased images 212 corresponding to one of the multiple MRI scan shots.

The image processor 22 then combines 216 the unaliased images 212 to produce per shot phase maps 218. The processor 22 then applies the ASSET calibration 214 to the phase maps 218 in order to recover a map of pseudo-sensitivities 220 from the plurality of unaliased images 212. Combining the mapped pseudo-sensitivities 220 back with the aliased images 208, or with the raw k-space data 202, the image processor 22 then unwraps 222 at least one pseudo-ASSET unaliased image 224 from the pluralities of aliased images and unaliased images, according to the map of pseudo-sensitivities 220.

For example, FIG. 2 shows an embodiment in which the method 200 is implemented to obtain a plurality of final unaliased ("pseudo-ASSET") images 224. FIG. 3 shows an embodiment in which the method 200 is implemented to obtain a single final unaliased ("pseudo-ASSET") image 224.

Figure 4:
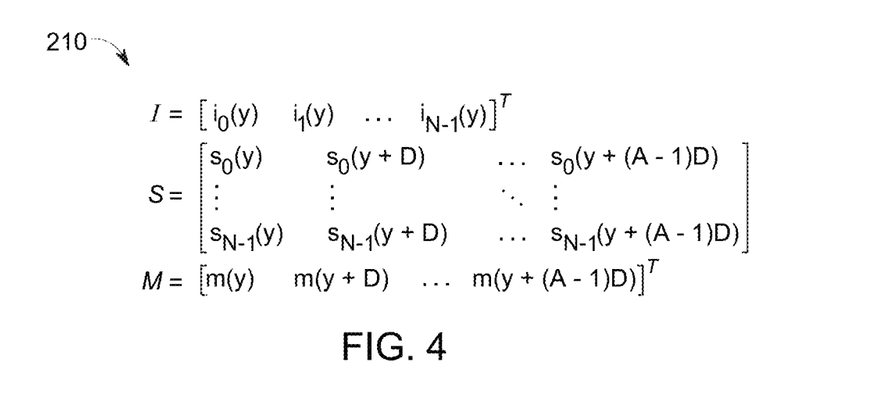
FIG. 4 shows a first matrix algorithm used in implementing the method of FIG. 2.

Referring now to FIG. 4, an exemplary matrix algorithm for the step of reconstructing 210 each one of the set of unaliased ASSET images 212 is depicted. As shown, I is an (N×1) array of measured (aliased image) intensities per coil of the RF antenna 56, M is an A×1 array of image intensities to be obtained from the measured intensities, and S is an N×A matrix of coil sensitivities. N is the number of coils, D is an aliasing span, and A is a number of aliased replicates at each pixel of the aliased image. The algorithm proceeds by matrix algebra in order to obtain values of the image intensities, M=I/S.

Figure 5:
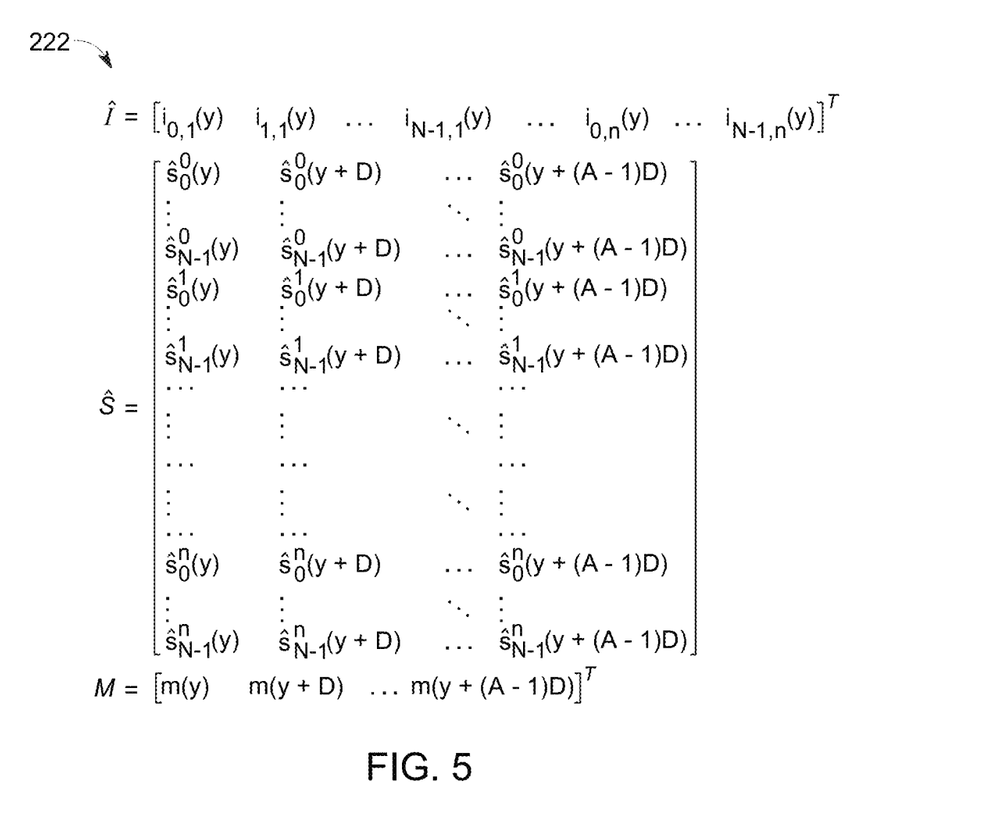
FIG. 5 shows a second matrix algorithm used in implementing the method of FIG. 2.

FIG. 5 shows an exemplary matrix algorithm for the step 222 of unwrapping the aliased images 208, according to the pseudo-sensitivities 220, so as to obtain the one or more final unaliased images 224. In this algorithm, Î is an (Nη×1) array of measured intensities per coil and per MRI scan shot (aliased image 208), M is an (A×1) array of image intensities to be obtained from the measured intensities, and ˆS is an (Nη×A) matrix of pseudo-sensitivities. As in the algorithm of FIG. 4, the algorithm of FIG. 5 proceeds by matrix algebra in order to obtain values of the image intensities, M=Î/ˆS. Within the matrix ˆS, $$\hat{s}_j^\eta(y) = s_j(y) \times e^{\theta_\eta(y)}$$

with $\theta_\eta$ being an estimated phase map for a given MRI scan shot $0 \ldots \eta$.

According to certain aspects of the invention, the algorithm of FIG. 5 utilizes a block diagonal matrix inversion scheme to create a mother inverse matrix whose elements are populated from several small matrix inverses. The mother inverse matrix is then interpolated and used for sample-by-sample multiplication during unaliasing.

The number η of MRI scan shots (aliased images 208) may be more than, less than, or equal to the number N of coils in the RF antenna 56. Also, the number η of MRI scan shots (aliased images 208) may be more than, less than, or equal to the number A of aliased replicates at each pixel of each image. Increasing the number η predictably will enhance the quality (clarity and contrast) of the final unaliased image(s) 224. But increasing the number η predictably also will increase the processing time required to render the final unaliased image(s) 224. It is believed that η greater than 1 but less than N or A is sufficient to obtain adequate image clarity, while η greater than N and greater than A exceeds a number of aliased images 208 that is the largest number at which improved image clarity can be seen by increasing the number of aliased images (MRI scan shots). An optimal value of η can be determined empirically based on the desired amount of susceptibility artifact reduction, which is inversely proportional to echo spacing time. Increasing η linearly decreases the echo spacing time. However it is important to note that when the image is reconstructed solely based on the first echo, as shown in FIG. 4, the number η of MRI scan shots may not be greater than the number N of coils, as for η>N the inherent phase map obtained for each shot will deteriorate according to the gyromagnetic ratio.

Figure 6:
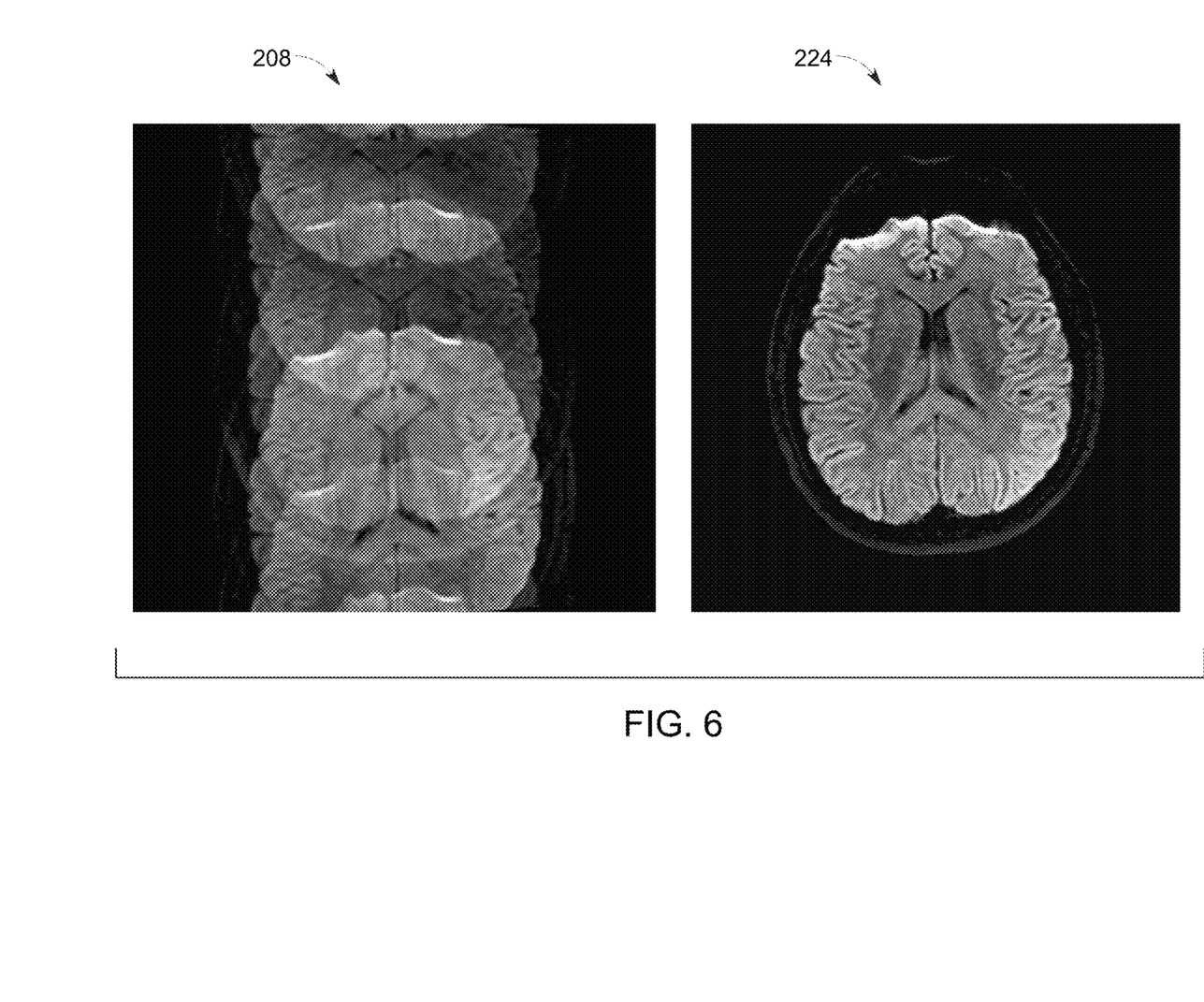
FIG. 6 shows pictorially images produced at different stages in the method of FIG. 2.

As will be appreciated, embodiments of the invention enhance MRI image clarity. FIG. 6 depicts a side-by-side comparison of multiple aliased images 208 and a single unaliased image 224. Enhanced clarity of the unaliased image 224 is clearly apparent.

Figure 7:
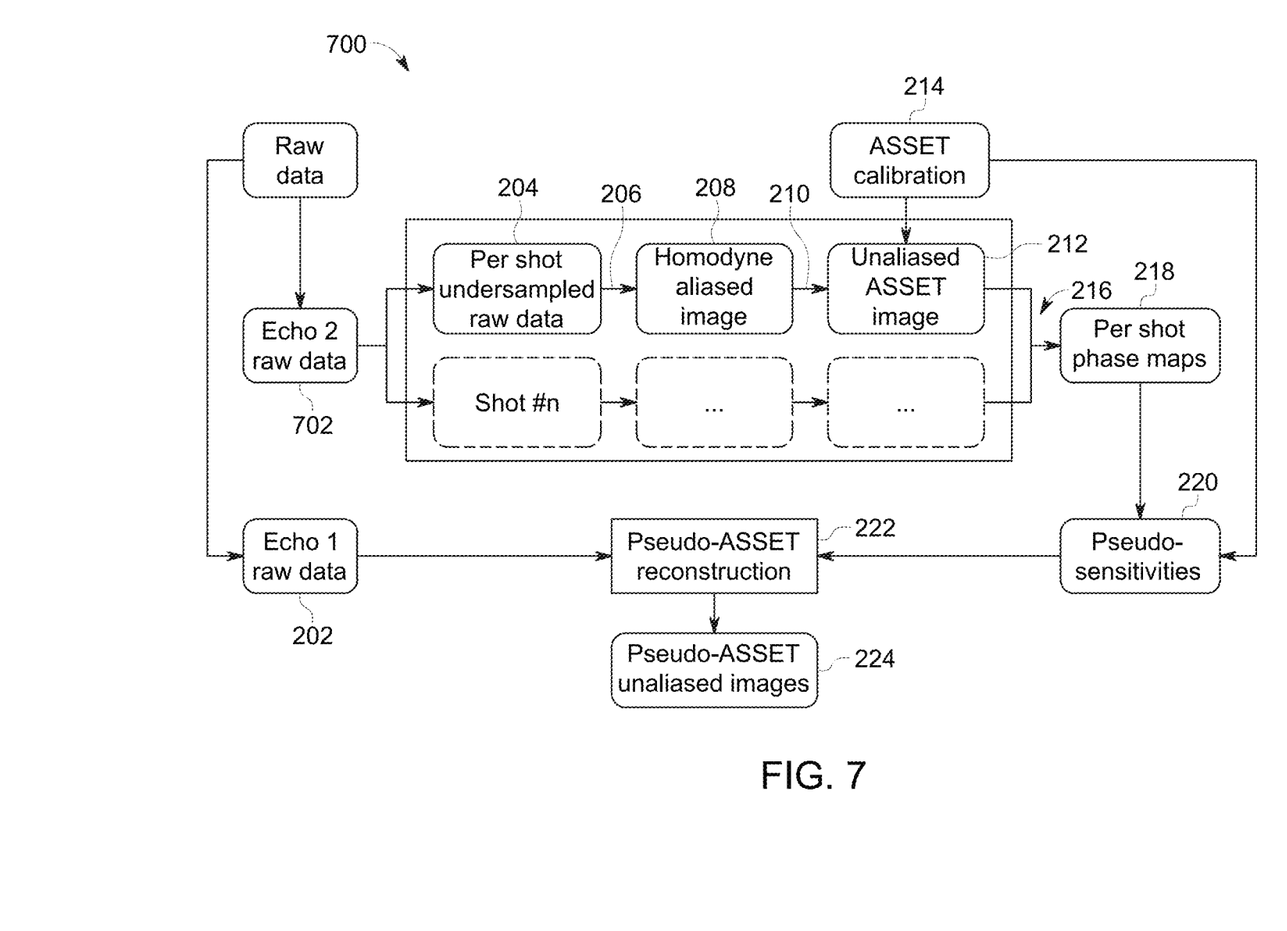
FIG. 7 shows schematically a second method for unwrapping a multi-shot magnetic resonance image to obtain a diffusion-weighted image, using dual echo pseudo-sensitivity reconstruction, according to other embodiments of the invention.

Referring now to FIG. 7, a dual echo method 700 for pseudo-sensitivity reconstruction to unwrap multiple magnetic resonance images in order to obtain a single diffusion weighted image according to an embodiment is depicted. According to the method 700, the image processor 22 handles data from a dual echo train by acquiring both a set of first echo raw k-space data 202 from first echoes, as well as a set of second echo raw k-space data 702 from second echoes. The set of second echo raw k-space data 702 are used as per shot undersampled raw data 204 for steps of reconstructing 206 homodyne aliased images 208, reconstructing 210 unaliased images 212, combining 216 the unaliased images 212 to produce per shot phase maps 218, and recovering pseudo-sensitivities 220. The set of first echo raw k-space data 202 is used as input data for ASSET calibration 214 and for unwrapping 222 the unaliased image(s) 224. The second echo raw k-space data 702 provide a relatively low resolution matrix of undersampled data 204, by comparison to the first echo raw k-space data 202 that provide a relatively high resolution matrix both for unwrapping 222 the unaliased images 224 and for performing the preliminary ASSET calibration 214. Thus, not shown is a step of interpolating the low-resolution phase maps 218 to match the resolution of the sensitivity maps produced during (conventional) ASSET calibration 214, prior to filling the pseudo-sensitivity maps 220. The second echo data 702 can be considered to provide a "navigator image," which has the result that a phase map of sufficient quality may be acquired for any value of η despite an unfavorable g-ratio.

In selecting whether to implement the method 200 of FIG. 2, or the method 700 of FIG. 7, certain considerations are important. The first mode (the method 200) does not require a second spin echo and has the advantage of shortening the scan duration. The short scan duration, however, requires parallel imaging methods, which are employed to produce the phase maps for each shot. As such, the coil geometry factor places an upper bound for the signal-to-noise ratio of the phase maps, thereby restricting the highest number of shots attainable. By comparison, the second mode (the method 700) does not suffer from any such limitations on the maximum number of shots and can therefore be switched on according to the local coil geometry. As both methods 200 and 700 can be implemented by the image processor module 22 in post processing of raw scan data 202, then the MRI apparatus 10 can be configured to implement either method 200 or method 700 by way, for example, of a menu selection within an operator interface program provided at the operator console 12.

Thus, embodiments of the invention implement a method for magnetic resonance imaging, which includes unwrapping a calibration image based on coil sensitivity data obtained according to an array spatial sensitivity encoding technique; acquiring raw scan data of a plurality of MRI scan shots; reconstructing an aliased image for each of the MRI scan shots; reconstructing an unaliased image for each of the MRI scan shots, according to the calibration image; recovering a plurality of pseudo-sensitivity maps from the plurality of unaliased images and from the calibration image; and unwrapping at least one final unaliased image from the plurality of aliased images, according to the plurality of pseudo-sensitivity maps. The plurality of pseudo-sensitivity maps may correspond to each of the unaliased images and to each coil of an RF antenna. The number of coils of the RF antenna may be less than the number of unaliased images. There may be fewer final unaliased images than aliased images. The number of unaliased images may be greater than the number of aliased replicates within each aliased image. Certain embodiments may include unwrapping a plurality of final unaliased images. Unwrapping the at least one final unaliased image may incorporate a block diagonal matrix inversion scheme on the plurality of pseudo-sensitivity maps.

Other embodiments provide an apparatus that includes an RF antenna having multiple coils; a controller operatively connected to energize the RF antenna and to receive signals from the RF antenna; and an image processor operatively connected to receive raw scan data from the controller and configured to implement a method that includes unwrapping a calibration image based on coil sensitivity data obtained according to an array spatial sensitivity encoding technique; acquiring raw scan data of a plurality of MRI scan shots; reconstructing an aliased image for each of the MRI scan shots; reconstructing an unaliased image for each of the MRI scan shots, according to the calibration image; recovering a plurality of pseudo-sensitivity maps from the plurality of unaliased images and from the calibration image; and unwrapping at least one final unaliased image from the plurality of aliased images, according to the plurality of pseudo-sensitivity maps. The image processor may be further configured to unwrap a plurality of final unaliased images. For example, each of the plurality of final unaliased images may correspond to a respective one of the plurality of aliased images. However, there may be fewer final unaliased images than aliased images. The plurality of pseudo-sensitivity maps may correspond to each of the unaliased images and to each coil of the RF antenna. The number of coils of the RF antenna may be less than the number of unaliased images. Also, the number of unaliased images may be greater than the number of aliased replicates in each image. The controller may be configured to implement diffusion MRI; in particular, the controller may be configured to implement diffusion weighted imaging. Unwrapping the at least one final unaliased image may incorporate a block diagonal matrix inversion scheme on the plurality of pseudo-sensitivity maps.

Yet other embodiments implement a method for magnetic resonance imaging, which includes unwrapping a calibration image based on coil sensitivity data obtained from a sequence of first echoes, according to an array spatial sensitivity encoding technique; acquiring a plurality of MRI scan shots from a sequence of second echoes; reconstructing an aliased image for each of the MRI scan shots; reconstructing an unaliased image for each of the MRI scan shots, according to the calibration image; recovering a plurality of pseudo-sensitivity maps from the plurality of unaliased images and from the calibration image; and unwrapping at least one final unaliased image from the plurality of aliased images, according to the plurality of pseudo-sensitivity maps. Certain embodiments may include unwrapping a plurality of final unaliased images. For example, each of the plurality of final unaliased images may correspond to a respective one of the plurality of aliased images. Or there may be fewer final unaliased images than aliased images. The plurality of pseudo-sensitivity maps may correspond to each of the unaliased images and to each coil of an RF antenna. The number of coils of the RF antenna may be less than the number of unaliased images. The number of unaliased images may be greater than the number of aliased replicates per image. Unwrapping the at least one final unaliased image may incorporate a block diagonal matrix inversion scheme on the plurality of pseudo-sensitivity maps.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described apparatus and methods, without departing from the spirit and scope of the invention herein involved, it is intended that all of the subject matter of the above description or shown in the accompanying drawings shall be interpreted merely as examples illustrating the inventive concept herein and shall not be constructed as limiting the invention.

What is claimed is:

1. A method for magnetic resonance imaging (MRI) performed by a MRI system, the MRI system including an radio frequency (RF) antenna having multiple coils, a controller operatively connected to energize the RF antenna and to receive signals from the RF antenna, and an image processor operatively connected to receive raw scan data from the controller and configured to implement the method, the method comprising:
   unwrapping a calibration image based on coil sensitivity data obtained according to an array spatial sensitivity encoding technique;
   acquiring raw scan data of a plurality of MRI scans;
   reconstructing an aliased image for each of the MRI scans;
   reconstructing an unaliased image for each of the MRI scans, according to the calibration image;
   recovering a plurality of pseudo-sensitivity maps from the plurality of unaliased images and from the calibration image; and
   unwrapping at least one final unaliased image from the plurality of aliased images, according to the plurality of pseudo-sensitivity maps.

2. The method of claim 1, wherein the plurality of pseudo-sensitivity maps correspond to each of the unaliased images and to each coil of an RF antenna.

3. The method of claim 2, wherein a number of coils of the RF antenna is less than a number of the unaliased images.

4. The method of claim 2, wherein there are fewer final unaliased images than aliased images.

5. The method of claim 1, wherein unwrapping the at least one final unaliased image incorporates a block diagonal matrix inversion scheme on the plurality of pseudo-sensitivity maps.

6. The method of claim 1, further comprising unwrapping a plurality of final unaliased images.

7. An apparatus comprising:
   an radio frequency (RF) antenna having multiple coils;
   a controller operatively connected to energize the RF antenna and to receive signals from the RF antenna; and
   an image processor operatively connected to receive raw scan data from the controller and configured to implement a method that includes unwrapping a calibration image based on coil sensitivity data obtained according to an array spatial sensitivity encoding technique; acquiring the raw scan data of a plurality of magnetic resonance imaging (MRI) scans; reconstructing an aliased image for each of the MRI scans; reconstructing an unaliased image for each of the MRI scans, according to the calibration image; recovering a plurality of pseudo-sensitivity maps from a plurality of unaliased images and from the calibration image; and
   unwrapping at least one final unaliased image from the plurality of aliased images, according to the plurality of pseudo-sensitivity maps.

8. The apparatus of claim 7, wherein the image processor is further configured to unwrap a plurality of final unaliased images.

9. The apparatus of claim 8, wherein each of the plurality of final unaliased images corresponds to a respective one of the plurality of aliased images.

10. The apparatus of claim 8, wherein there are fewer final unaliased images than aliased images.

11. The apparatus of claim 7, wherein the plurality of pseudo-sensitivity maps correspond to each of the unaliased images and to each coil of the RF antenna.

12. The apparatus of claim 11, wherein a number of coils of the RF antenna is less than a number of the unaliased images.

13. The apparatus of claim 7, wherein unwrapping the at least one final unaliased image incorporates a block diagonal matrix inversion scheme on the plurality of pseudo-sensitivity maps.

14. The apparatus of claim 7, wherein the controller is configured to implement diffusion MRI.

15. The apparatus of claim 14, wherein the controller is configured to implement diffusion weighted imaging.

16. A method for magnetic resonance imaging (MRI) performed by a MRI system, the MRI system including an radio frequency (RF) antenna having multiple coils, a controller operatively connected to energize the RF antenna and to receive signals from the RF antenna, and an image processor operatively connected to receive raw scan data from the controller and configured to implement the method, the method comprising:
   unwrapping a calibration image based on coil sensitivity data obtained from a sequence of first echoes, according to an array spatial sensitivity encoding technique;
   acquiring a plurality of MRI scan shots from a sequence of second echoes; reconstructing an aliased image for each of the MRI scan shots;
   reconstructing an unaliased image for each of the MRI scan shots, according to the calibration image;
   recovering a plurality of pseudo-sensitivity maps from the plurality of unaliased images and from the calibration image; and
   unwrapping at least one final unaliased image from the plurality of aliased images, according to the plurality of pseudo-sensitivity maps.

17. The method of claim 16, further comprising unwrapping a plurality of final unaliased images.

18. The method of claim 17, wherein each of the plurality of final unaliased images corresponds to a respective one of the plurality of aliased images.

19. The method of claim 16, wherein unwrapping the at least one final unaliased image incorporates a block diagonal matrix inversion scheme on the plurality of pseudo-sensitivity maps.

20. The method of claim 16, wherein the plurality of pseudo-sensitivity maps correspond to each of the unaliased images and to each coil of an RF antenna.

* * * * *